US008065972B2

(12) United States Patent
Howard et al.

(10) Patent No.: US 8,065,972 B2
(45) Date of Patent: Nov. 29, 2011

(54) UNDERWATER VEHICLE

(75) Inventors: Robert James Howard, Clifton, VA (US); John W. Rapp, Manassas, VA (US)

(73) Assignee: Lockheed Martin Corporation, Bethesda, MD (US)

( * ) Notice: Subject to any disclaimer, the term of this patent is extended or adjusted under 35 U.S.C. 154(b) by 373 days.

(21) Appl. No.: 12/399,944

(22) Filed: Mar. 7, 2009

(65) Prior Publication Data

US 2011/0179988 A1 Jul. 28, 2011

(51) Int. Cl.
*B63G 8/08* (2006.01)

(52) U.S. Cl. ................. 114/337; 440/3; 440/6

(58) Field of Classification Search ........... 114/20.1, 114/20.2, 245, 246, 337, 331, 25; 440/3, 440/6
See application file for complete search history.

(56) References Cited

U.S. PATENT DOCUMENTS

| | | | | |
|---|---|---|---|---|
| 3,157,145 A * | 11/1964 | Farris et al. | | 114/332 |
| 3,896,622 A * | 7/1975 | Daniello | | 60/641.7 |
| 4,170,878 A * | 10/1979 | Jahnig | | 60/641.7 |
| 4,183,316 A * | 1/1980 | Bennett | | 114/331 |
| 4,233,813 A * | 11/1980 | Simmons | | 60/496 |
| 5,291,847 A * | 3/1994 | Webb | | 114/331 |
| 6,371,041 B1 * | 4/2002 | Ness | | 114/333 |
| 7,353,768 B1 * | 4/2008 | Jones et al. | | 114/337 |
| 2003/0167998 A1 * | 9/2003 | Huntsman | | 114/312 |
| 2007/0119495 A1 * | 5/2007 | Sumrall | | 136/205 |

* cited by examiner

*Primary Examiner* — Stephen Avila
(74) *Attorney, Agent, or Firm* — DeMont & Breyer, LLC

(57) ABSTRACT

An underwater vehicle comprising an electrical power generation system that converts thermal energy from a body of water into electrical energy is disclosed. The vehicle comprises the electrical power generation system and a thermal mass whose temperature is based on the temperature of water at a first depth of a body of water. The vehicle is moved to a second depth of the body of water, wherein water at the second depth is a different temperature that the water at the first depth. The electrical power generation system generates electrical energy based on the difference between the temperature of the water at the second depth and the temperature of the thermal mass. The electrical power generation system is able to generate electrical energy when the temperature difference is negative as well as when the temperature difference is positive.

22 Claims, 7 Drawing Sheets

UNDERWATER VEHICLE

FIELD OF THE INVENTION

The present invention relates to underwater vehicles in general, and, more particularly, to power generation in underwater vehicles.

BACKGROUND OF THE INVENTION

Underwater vehicles, such as unmanned undersea vehicles (UUV's), submarines, autonomous buoys, and the like, include propulsion systems that move them through a body of water. In addition, these vehicles often include on-board electronics, such as sensors for monitoring environmental conditions or detecting other vehicles. As a result, such vehicles require a power source that provides energy for the propulsion system and/or their payloads.

Conventional power plants for such vehicles include battery systems, radio isotope generators, solar-cell systems, or combustion-based power supplies. There are significant drawbacks to such power plants, however.

Battery systems are characterized by a limited lifetime, particularly for small form-factor systems suitable for many undersea vehicle applications. Further, high power density battery systems represent a significant environmental hazard since they typically include hazardous materials. Leakage of such material into the water can contaminate an area and harm local marine life.

Radio isotope generators also represent a potential environmental hazard. Further, radio isotope generators tend to have a readily detected energy signature that makes them undesirable for use in applications that require stealth.

Solar-cell based power plants are capable of generating electrical energy only when environmental conditions are favorable (e.g., sunny, clear skies, etc.). Further, such power plants only operate on the surface.

Combustion-based power plants can only carry a finite fuel supply. As a result, the length of operation is limited by the fuel capacity of the vehicle. Applications such as loitering sensor systems, therefore, are not well-suited to the use of a combustion-based power plant. Further, combustion-based power plants also represent an environmental hazard and typically emit a characteristic acoustic signature.

A power generation system for providing power to an underwater vehicle that is eco-friendly, stealthy, and long-lasting would represent an advance in the state-of-the art.

SUMMARY OF THE INVENTION

The present invention provides an underwater vehicle capable of harvesting thermal energy from the body of water in which it resides. As a result, vehicles in accordance with the present invention are capable of continuous operation for a substantially longer period of time than vehicles of the prior art. Further, embodiments of the present invention are eco-friendly and potentially stealthy. Embodiments of the present invention include a vehicle comprising an electrical generation system and a chamber for containing a bulk thermal mass, wherein the electrical generation system generates electrical energy based on a difference between the temperature of the thermal mass and the temperature of the water that surrounds the vehicle. The vehicle is movable between different regions of a body of water, wherein the different regions are characterized by different water temperatures.

Embodiments of the present invention are particularly well-suited for use in unmanned undersea vehicles, autonomous buoys, manned underwater vehicles, and the like.

While the vehicle is in a first region of a body of water, the thermal mass attains a temperature based on the water in this first region. When the vehicle subsequently moves to a second region of water that has a different temperature than the first region, the vehicle insulates and transports the thermal mass, in bulk, along with it. When the vehicle is positioned in the second region, its electrical generation system is provided a temperature differential based upon water from the second region and the thermal mass. The vehicle comprises a reconfigurable valve system so that the thermal mass can provide either a local heat sink or heat source as compared to the local water. As a result, the electrical generation system can generate electrical energy while positioned in any region whose water temperature is sufficiently different than the thermal mass—regardless of the sign of the temperature differential. Generated electrical energy can be stored for later use or used directly to power a propulsion system, on-board electronics, etc.

By virtue of its ability to harvest thermal energy from its surrounding environment, the present invention enables a vehicle to remain on station for long periods of time. In some regions of the world, such as tropical areas, a vehicle in accordance with the present invention can remain on station substantially indefinitely.

In some embodiments, the electrical generation system comprises a Rankine-cycle engine and a turbogenerator. When the vehicle is located in a region of cold water, a valve system enables a flow of working fluid from a first heat exchanger, which is thermally coupled with the thermal mass, to a turbogenerator to a second heat exchanger, which is thermally coupled with water from the cold-water region. The first heat exchanger is relatively warmer than the second heat exchanger by virtue of the fact that the temperature of the thermal mass is based on water in a warm-water region. As a result, the working fluid vaporizes at the first heat exchanger and condenses at the second heat exchanger. When the vehicle is located in a warm-water region, the valve system enables a flow of working fluid from the second heat exchanger to the turbogenerator to the first heat exchanger. In the warm-water region, the second heat exchanger is relatively warmer than the first heat exchanger by virtue of the fact that the temperature of the thermal mass is based on water from a cold-water region. As a result, the working fluid vaporizes at the second heat exchanger and condenses at the first heat exchanger.

In some embodiments, the thermal mass comprises a phase-change material, such as a clathrate compound. In some embodiments, the thermal mass comprises a clathrate compound that has a freezing point higher than the temperature of the water in a cold-water region.

In some embodiments, the thermal mass is a volume of water taken into the chamber while the vehicle is in either a warm-water region or cold-water region.

In some embodiments, the electrical generation system comprises a solid-state thermoelectric device.

An embodiment of the present invention comprises a vehicle comprising: a hull; a thermal mass, wherein the thermal mass is contained within the hull, and wherein the temperature of the thermal mass is based on the temperature of water in a first region of a body of water; a first heat exchanger, wherein the temperature of the first heat exchanger is based on the temperature of the thermal mass; a second heat exchanger, wherein the temperature of the second heat exchanger is based on the temperature of water in a second region of the body of water; an electrical generation system, wherein the electrical generation system generates electrical energy based on a temperature difference between the first heat exchanger and the second heat exchanger; and a propulsion system, wherein the propulsion system receives electrical energy generated by the electrical generation system and propels the hull through the body of water in response to the received electrical energy.

DETAILED DESCRIPTION

Figure 1:
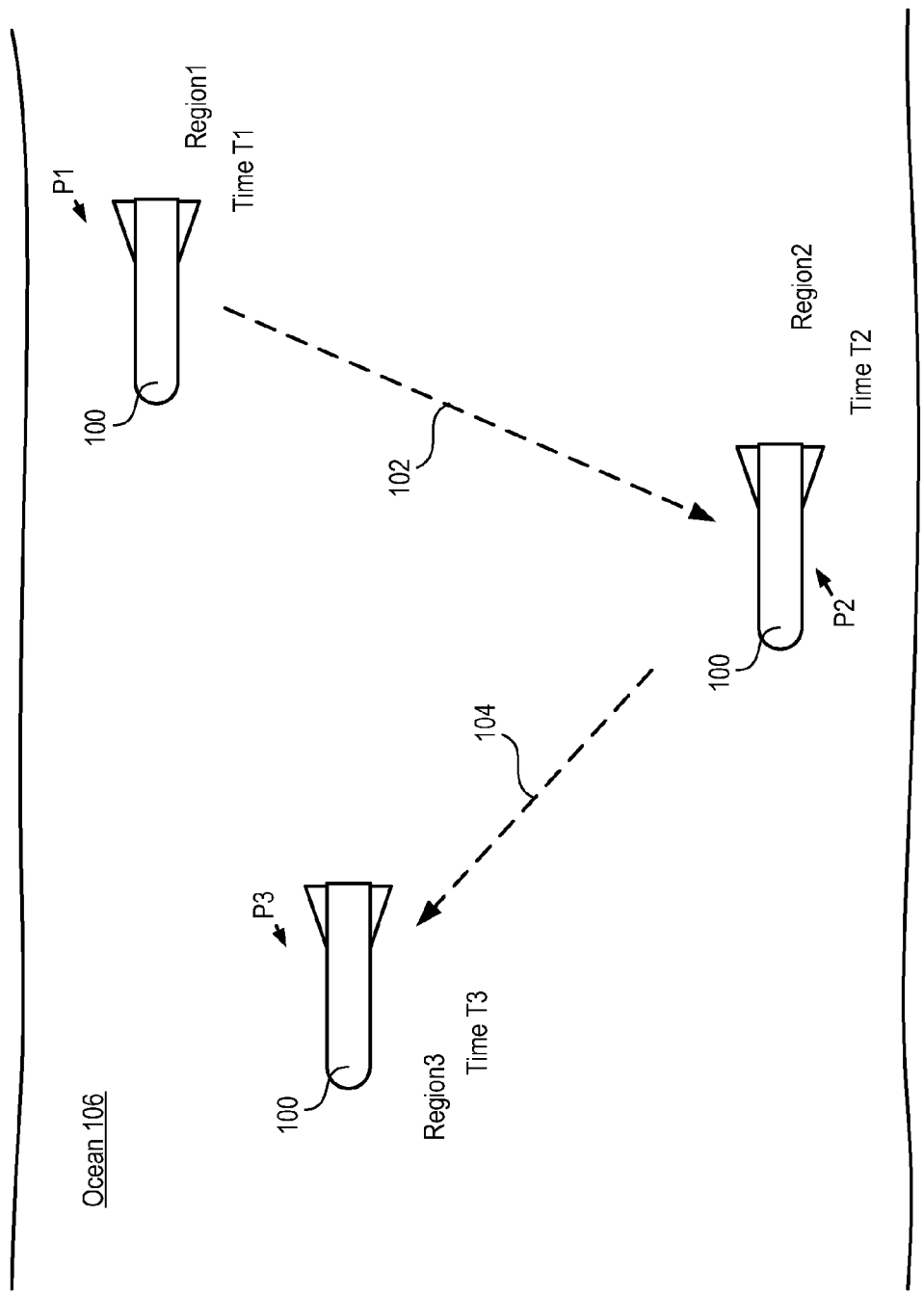
FIG. 1 depicts a plot of exemplary motion of an unmanned undersea vehicle in accordance with an illustrative embodiment of the present invention.

FIG. 1 depicts a plot of exemplary motion of an unmanned undersea vehicle in accordance with an illustrative embodiment of the present invention. Successive positions for vehicle 100 are depicted as P1 in Region1 at time T1, P2 in Region2 at time T2, and P3 in Region3 at time T3.

Vehicle 100 is an unmanned undersea vehicle capable of autonomous motion. Vehicle 100 is described in more detail below and with respect to FIG. 3.

Region1 is a surface region of ocean 106. The temperature, t1, of the water in Region1 is warm, relative to the water in deeper regions of ocean 106, such as Region2 and Region3.

Region2 is a deep level region of ocean 106. The temperature, t2, of the water in Region2 is cold, relative to the temperature of the water in Region1.

Region3 is a mid-level region of ocean 106. The temperature, t3, of water in Region3 is between the temperatures of the water in Region1 and Region2 (i.e., t1>t2>t3).

As discussed below, and with respect to FIG. 6, in some regions of ocean 106, upwelling currents draw colder water from deep level regions of ocean 106 toward its surface. As a result, localized regions of water that have different temperatures can be present at the same depth of ocean 106.

Although in the illustrative embodiment, vehicle 100 operates in an ocean, one skilled in the art will recognize that the present invention is suitable for operation in any body of water that exhibits a suitable thermal gradient.

Figure 2:
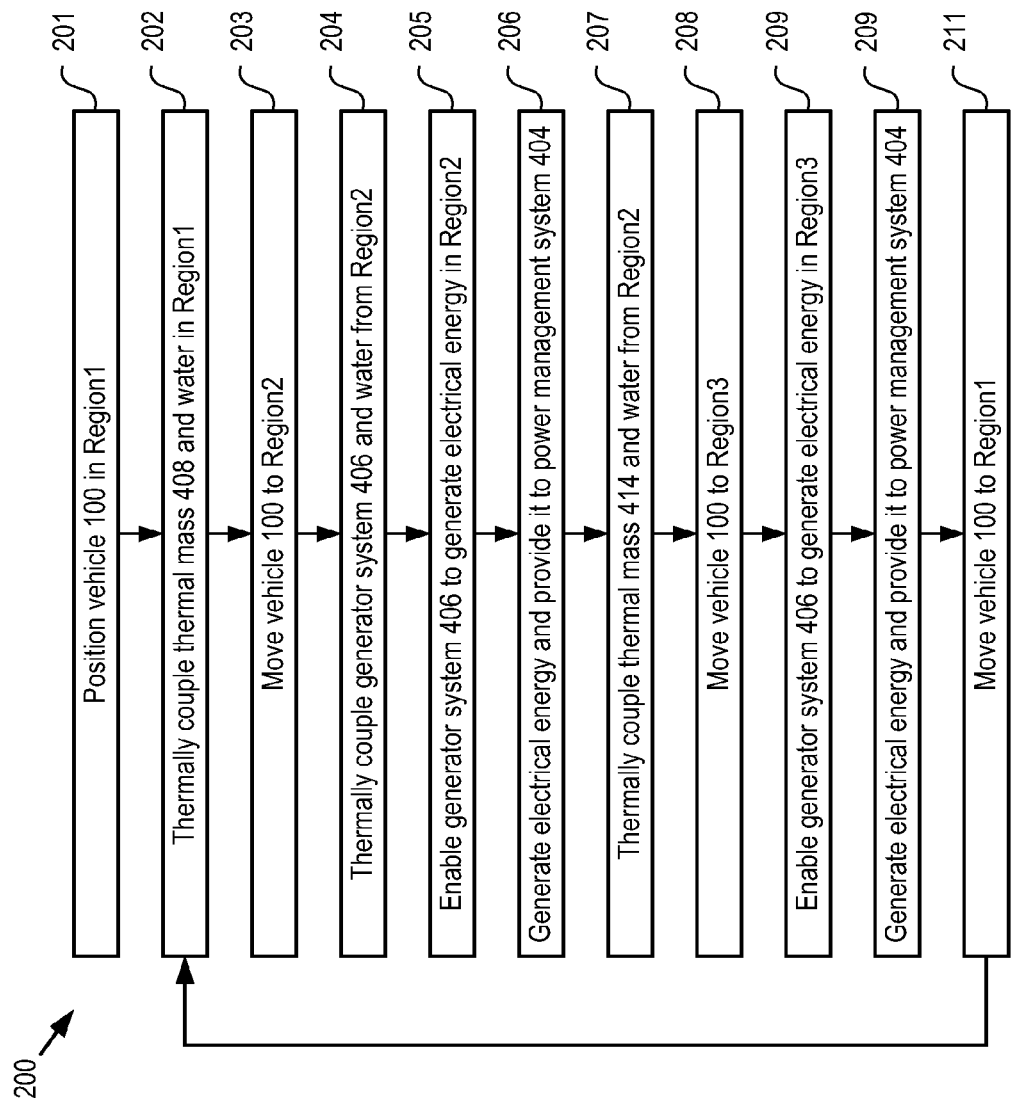
FIG. 2 depicts a method for moving vehicle along a path through a body of water in accordance with the illustrative embodiment of the present invention.

FIG. 2 depicts a method for moving vehicle along a path through a body of water in accordance with the illustrative embodiment of the present invention. Method 200 comprises operations suitable for moving vehicle 100 from Region1 to Region2 to Region3. Method 200 is described with continuing reference to FIG. 1 as well as reference to FIGS. 3, 4, 5A, and 5B. Method 200 begins with operation 201, wherein vehicle 100 is positioned in Region1.

Figure 3:
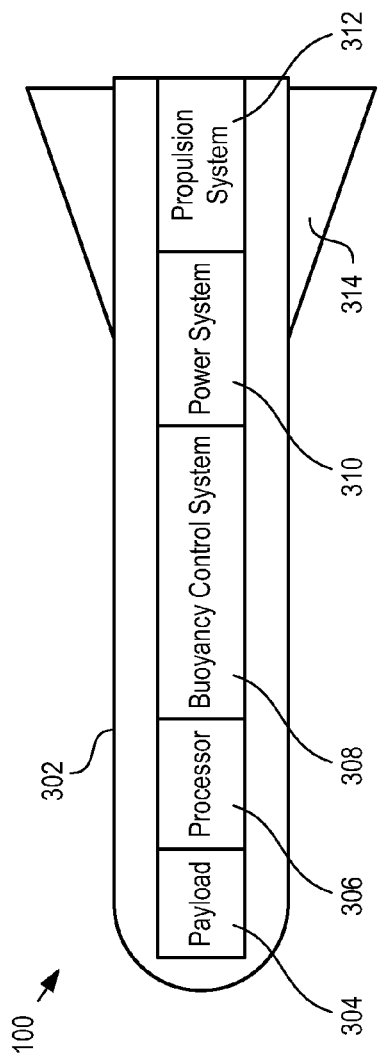
FIG. 3 depicts a schematic diagram of vehicle 100.

FIG. 3 depicts a schematic diagram of vehicle 100. Vehicle 100 comprises hull 302, payload 304, processor 306, buoyancy control 308, power system 310, propulsion system 312, and control planes 314.

Hull 302 is a substantially streamlined shell that contains and protects payload 304, processor 306, buoyancy control 308, power system 310, and propulsion system 312. It will be clear to one skilled in the art, after reading this specification, how specify, make, and use hull 302.

Payload 304 is a sensor package that enables vehicle 100 to detect other vehicles, monitor environmental conditions, and the like. In some embodiments, payload 304 comprises one or more of: explosives; non-explosive weapons; sensors, such as acoustic sensors, gravity sensors, inertial sensors, GPS systems, thermal sensors, radiation sensors, magnetic sensors, etc.; and cargo. It will be clear to one skilled in the art, after reading this specification, how to specify, make, and use payload 304.

Processor 306 is an information processing and control system that is suitable for receiving and processing signals from payload 304, transmitting and receiving communications to/from vehicle 100, providing navigation and mission control, and controlling buoyancy control 308, power system 310, propulsion system 312, and control planes 314. It will be clear to one skilled in the art, after reading this specification, how to specify, make, and use processor 306.

Buoyancy control system 308 controls the buoyancy of vehicle 100. Buoyancy control system 308 comprises ballast tanks, flood and vent valves, and buoyancy sensors. It will be clear to one skilled in the art, after reading this specification, how to specify, make, and use buoyancy control system 308.

Power system 310 is a system for generating and storing electrical energy. Power system 310 is described in more detail below and with respect to FIGS. 4 and 5.

Propulsion system 312 is an electrically powered propulsion system for driving vehicle 100 through a body of water. Propulsion system 312 is powered by electrical energy provided to it by power system 310. In the illustrative embodiment, propulsion system 312 comprises a conventional electric motor that drives a propeller. In some embodiments, propulsion system is an impeller-based propulsion system. It will be clear to one skilled in the art, after reading this specification, how to specify, make, and use propulsion system 312.

Control planes 314 are conventional control planes that stabilize vehicle 100 as it moves. Control planes 314 comprise movable control surfaces that enable control planes 314 to control the direction of travel of vehicle 100. It will be clear to one skilled in the art, after reading this specification, how to specify, make, and use control planes 314.

Figure 4:
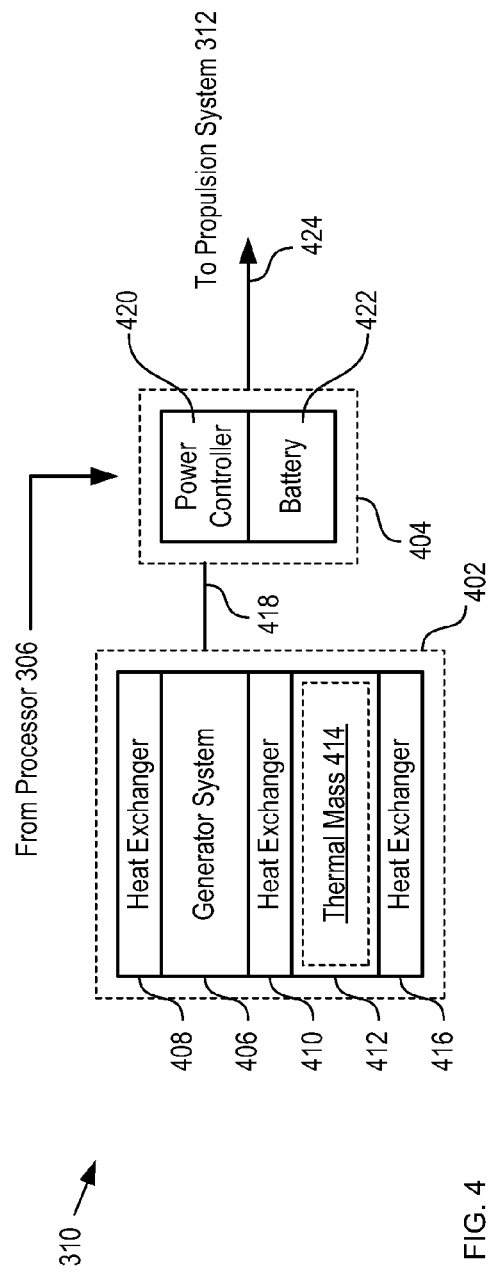
FIG. 4 depicts a block diagram of power system 310 in accordance with the illustrative embodiment of the present invention.

FIG. 4 depicts a block diagram of power system 310 in accordance with the illustrative embodiment of the present invention. Power system 310 comprises electrical generation system 402 and energy management system 404.

Electrical generation system 402 is an electrical generation system that comprises generation system 406, heat exchangers 408, 410, and 416, and chamber 412. Electrical generation system 402 generates electrical energy based on a temperature differential between the temperatures of heat exchanger 408 and heat exchanger 410. Electrical generation system 402 is described in more detail below and with respect to FIGS. 5A and 5B.

Heat exchanger 408 is a heat exchanger that thermally couples generation system 406 and water that immediately surrounds vehicle 100. Heat exchanger 408 is physically adapted to operate over a depth range from Region1 to Region2. In some embodiments, the depth range from Region1 to Region2 can exceed 2000 meters.

Heat exchanger 410 is a heat exchanger that thermally couples generation system 406 and thermal mass 414. Heat exchanger 410 is physically adapted to operate over a depth range from Region1 to Region2.

Chamber 412 is a container that is suitable for holding thermal mass 414. Chamber 412 is thermally coupled with heat exchanger 416.

Heat exchanger 416 is a bi-state heat exchanger. In a first state, heat exchanger 416 thermally couples thermal mass 414 and the environment that surrounds vehicle 100. In a second state, heat exchanger 416 decouples thermal mass 414 and the environment that surrounds vehicle 100, thereby thermally insulating thermal mass 414.

Thermal mass 414 is a phase-change material. For the purposes of this Specification, included the appended claims, a phase change material is a material that freezes at a temperature equal to or higher than that of the water at Region2.

In some embodiments, thermal mass 414 is a clathrate compound. Clathrate compounds are well-known substances in which one chemical can be trapped and held within a lattice of another type of chemical. The heat capacity of a clathrate compound can be as high as 80-100 times that of a comparable volume of water. As a result, a clathrate-based (or other phase-change material-based) energy conversion system has four to five times the energy generation capability of a purely water-based energy conversion system.

The material properties of a clathrate compound are dependent upon the specific types of chemical used as the trapped constituent, as well as the ratio of the chemicals. As a result, a clathrate compound having a desired freezing point can readily be formed by one skilled in the art. Suitable materials for use as a trapped constituent in thermal mass 414 include, without limitation, propane, methane, ethane, fluoro-propane, fluoro-methane, fluoro ethane, other light hydrocarbons, hydrocarbon mixtures, anti-freeze compounds, and the like.

It should be noted that clathrate compounds are typically characterized by an equilibrium vapor pressure for its trapped constituent. The equilibrium vapor pressure of the trapped constituent is the pressure exerted by the propane vapor when it is in equilibrium with the clathrate compound at a given temperature. In other words, for any given temperature, the equilibrium vapor pressure is the minimum pressure required to keep the trapped constituent from boiling out of the clathrate compound.

In some cases, vehicle 100 might be located in a region of ocean 106 wherein hydrostatic pressure is not sufficient to ensure that the trapped constituent of a clathrate compound does not boil out of the clathrate compound. In some embodiments, therefore, chamber 412 must be pressurized to a pressure greater than the equilibrium vapor pressure of the trapped constituent to maintain the composition of the clathrate compound.

It should be noted that some phase-change materials, such as a clathrate compounds, can be formed such that they are more buoyant as they freeze. The changeable buoyancy of such materials can be exploited to assist propulsion system 312 in driving vehicle 100 between depths of ocean 106.

Energy management system 404 comprises power controller 420 and battery 422.

Battery 422 is a conventional battery system suitable for storing electrical energy in an underwater vehicle.

Power controller 420 controls the flow of electrical energy between generation system 406, battery 422, and propulsion system 312 in conventional fashion.

Figure 5A:
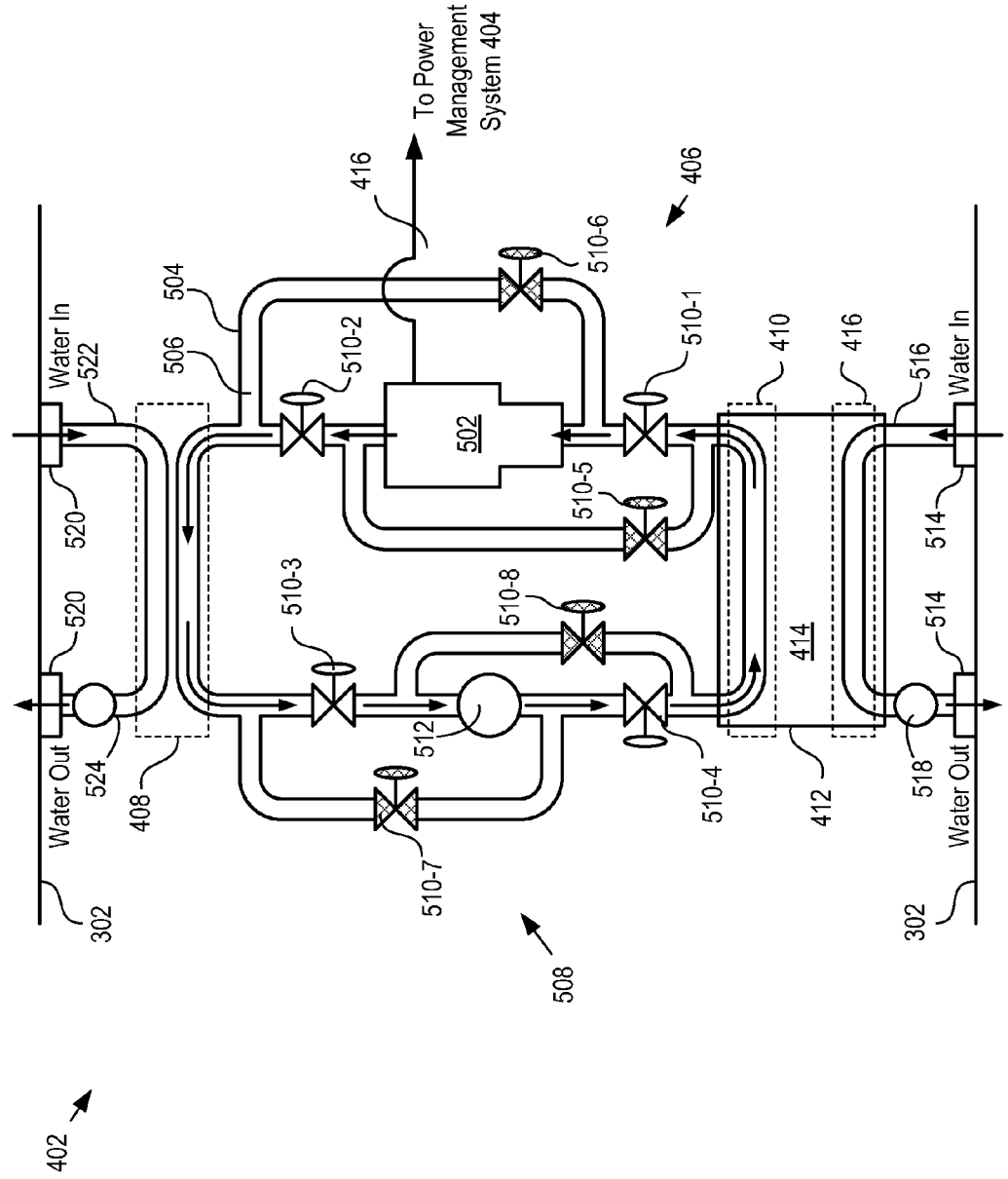
FIG. 5A depicts a schematic diagram of details of electrical generation system 402, configured for operation in Region2, in accordance with the illustrative embodiment of the present invention.

FIG. 5A depicts a schematic diagram of details of electrical generation system 402, configured for operation in Region2, in accordance with the illustrative embodiment of the present invention. Electrical generation system 402 comprises generator system 406 and heat exchangers 408, 412, and 416.

At operation 202, thermal mass 414 and water in Region1 are thermally coupled via heat exchanger 416. Heat exchanger 416 comprises valves 514, conduit 516, and pump 518. In order to enable thermal coupling of thermal mass 414 and water in Region1, valves 514 are opened and pump 518 is energized. As a result, water from Region1 is pumped through conduit 516, which runs through thermal mass 414. Once thermal mass 414 has attained a desired temperature, based on the temperature, t1, of the water in Region1, pump 518 is shut off and valves 514 are closed. This enables chamber 404 thermally isolate thermal mass 414 from water outside hull 302. It should be noted that valves 514 represent only one type of element suitable for impeding or enabling the flow of water through conduit 516. Suitable elements for use in valves 514 include, without limitation, valves, doors, flappers, butterfly valves, needle valves, and the like. It will be clear to one skilled in the art, after reading this specification, how to specify, make, and use valves 514.

In some embodiments, operation 202 comprises sub-operations that enable water from Region1 to fill chamber 404. In such embodiments, therefore, thermal mass 414 comprises water from Region1.

At operation 203, vehicle 100 is moved along path 102 from Region1 to Region2. Vehicle 100 moves along path 102 by means of:
  i. a reduction of the buoyancy of vehicle 100; or
  ii. self-propulsion using stored electrical energy; or
  iii. self-propulsion using electrical energy generated by electrical generation system 402; or
  iv. any combination of i, ii, and iii.

At operation 204, generator system 406 and water in Region2 are thermally coupled via heat exchanger 408. Heat exchanger 408 comprises valves 520, conduit 522, and pump 524. In order to enable thermal coupling of generator system 406 and water in Region2, valves 520 are opened and pump 524 is energized. As a result, water from Region2 is pumped through conduit 522. It should be noted that valves 520 represent only one type of element suitable for impeding or enabling the flow of water through conduit 522. Suitable elements for use in valves 520 include, without limitation, valves, doors, flappers, butterfly valves, needle valves, and the like. It will be clear to one skilled in the art, after reading this specification, how to specify, make, and use valves 520.

At operation 205, generator system 406 is enabled for the generation of electrical energy at the depth of Region2. Generator system 406 is a Rankine-cycle engine that comprises turbogenerator 502, closed-loop conduit 504, working fluid 506, valve system 508, and pump 512.

Closed-loop conduit 504 is a closed-circuit loop of pipe that contains a working fluid 116, such as ammonia. It should be noted that ammonia is only one potential working fluid, and one skilled in the art will recognize that other fluids can be used as working fluid 504. Typically it is desirable that working fluid 504 have a large change in vapor pressure between the temperature, t1, of the water in Region1 and the temperature, t2, of the water in Region2. Other considerations for the selection of a suitable working fluid include corrosiveness, thermal capacity, thermal conductivity, median pressure, and environmental hazard.

Closed-loop conduit 504 and conduit 522 are thermally coupled at heat exchanger 408. In similar fashion, closed-loop conduit 504 and thermal mass 414 are thermally coupled at heat exchanger 410.

Valve system 508 comprises valves 510-1 through 510-8. Valve system 508 enables reconfiguration of the flow of working fluid 506 through closed-loop conduit 504. As a result, the flow of working fluid 506 through turbogenerator 502 remains in the same direction regardless of the relative temperatures of conduit 522 and thermal mass 414. As a result, valve system 508 enables turbogenerator 502 to generate electrical energy when thermal mass 414 is warmer than the water that flows through conduit 522 as well as when thermal mass 414 is colder than the water that flows through conduit 522.

Pump 512 pumps working fluid through closed-loop conduit 504.

In order to enable generator system 406 to generate electrical energy when vehicle 100 is in Region2, valve system 508 is reconfigured such that working fluid 506 flows through closed-loop conduit 504 in a counter-clockwise direction, as shown. Specifically, valves 510-1 through 510-4 are opened and valves 510-5 through 510-8 are closed.

At operation 206, generator system 406 generates electrical energy and provides it to power management system 404. Generator system 406 generates electrical energy by enabling pump 512 to pump working fluid 506 to heat exchanger 410, where the heat of thermal mass 414 vaporizes working fluid 506. The expanding vapor turns turbogenerator 502. In response, turbogenerator 502 generates electrical energy and provides it to power management system 404 on cable 416. This electrical energy can be used to power propulsion system 312, run on-board electronics, and/or be stored in battery 422.

After passing through turbogenerator 502, the vapor is conveyed to heat exchanger 408. At heat exchanger 408, closed-loop conduit 504 and conduit 522 are thermally coupled, which enables the cold water flowing through conduit 522 to act as a heat sink for the vaporized working fluid 506. As a result, the vaporized working fluid is condensed at heat exchanger 408.

Once it is condensed, pump 512 recycles working fluid 506 back into heat exchanger 410 where it is vaporized again to continue the cycle that powers turbogenerator 502.

As vehicle 100 travels through Region2, thermal mass 414 cools by virtue of the fact that it is transferring its heat to working fluid 506. As a result, the temperature of thermal mass 414 moves toward t2 over time. The generation capability of generator system 402, therefore, decreases over time.

At optional operation 207, thermal mass 414 and water in Region2 are thermally coupled via heat exchanger 416. In order to enable thermal coupling of thermal mass 414 and water in Region2, valves 514 are opened and pump 518 is energized. As a result, water from Region2 is pumped through conduit 516, which runs through thermal mass 414. As a result, the water in Region2 cools thermal mass 414 to induce thermal mass 414 to begin to freeze. Once a desired fraction of thermal mass 414 is frozen, pump 518 is shut off and valves 514 are closed. This enables chamber 404 thermally isolate thermal mass 414 from water outside hull 302.

In some embodiments, vehicle 100 is held in Region2 for a time sufficient for thermal mass 414 to freeze completely. In some embodiments, vehicle 100 is held in Region2 for a time sufficient for thermal mass 414 to reach a desired temperature, but not freeze. In some embodiments, a monitor provides a signal indicative of the fraction of thermal mass 414 that has frozen.

In some embodiments, operation 207 comprises sub-operations that enable water from Region2 to fill chamber 404. In such embodiments, therefore, thermal mass 414 comprises water from Region2.

At operation 208, vehicle 100 is moved from Region2 to Region3 along path 104. The water in Region3 has a temperature, t3, which is warmer than t2 but colder than t1. At temperature t3, however, the vapor pressure of working fluid 504 is significantly higher than its vapor pressure at temperature t2. Vehicle 100 moves along path 104 by means of:
    i. an increase in the buoyancy of vehicle 100; or
    ii. self-propulsion using stored electrical energy; or
    iii. self-propulsion using electrical energy generated by electrical generation system 402; or
    iv. any combination of i, ii, and iii.

At operation 209, generator system 406 is enabled for the generation of electrical energy at the depth of Region3.

Figure 5B:
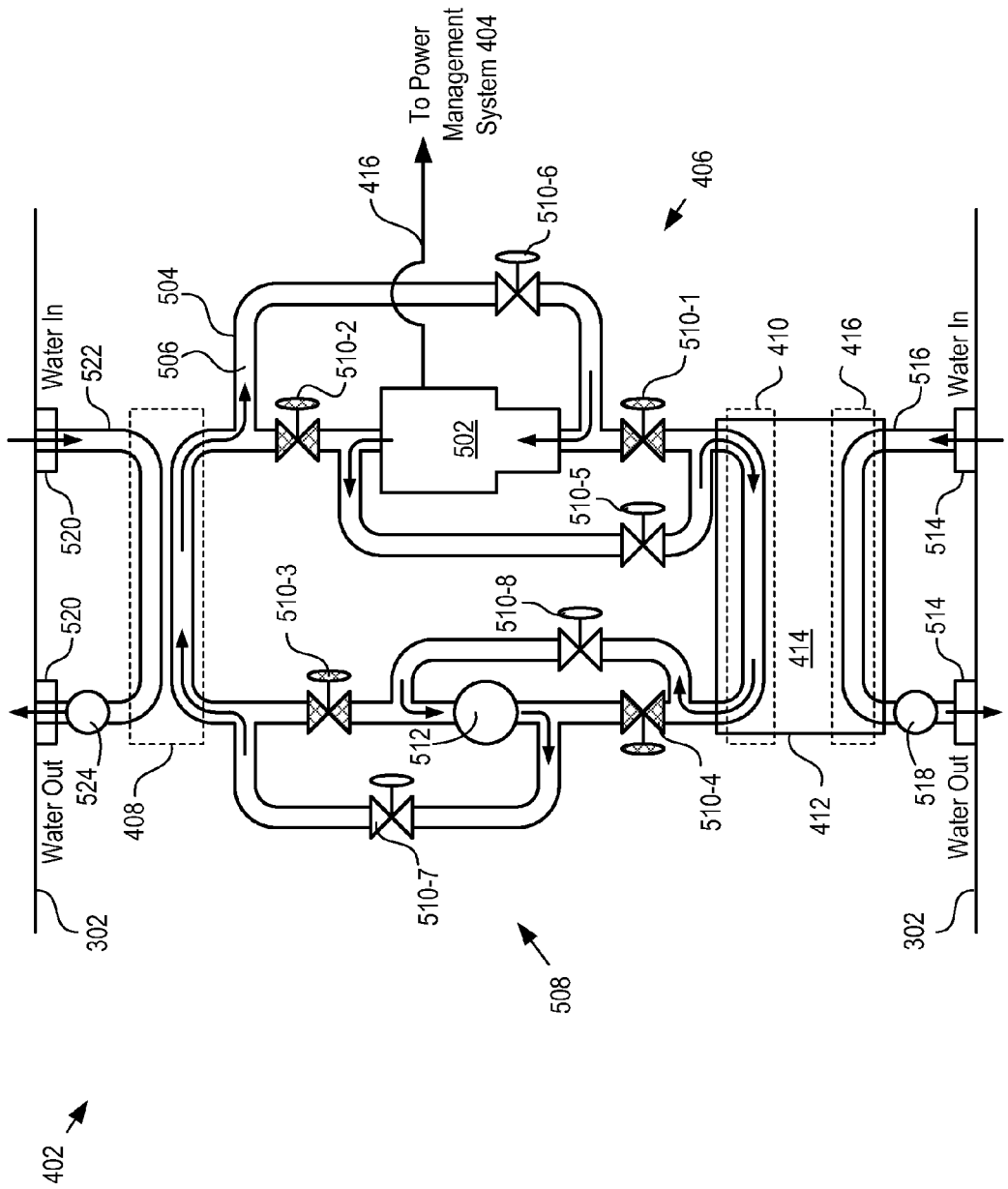
FIG. 5B depicts a schematic diagram of details of electrical generation system 402, configured for operation in Region3, in accordance with the illustrative embodiment of the present invention.

FIG. 5B depicts a schematic diagram of details of electrical generation system 402, configured for operation in Region3, in accordance with the illustrative embodiment of the present invention.

In order to enable generator system 406 to generate electrical energy when vehicle 100 is in Region3, valve system 508 is reconfigured such that working fluid 506 flows through closed-loop conduit 504 in a clockwise direction, as depicted in FIG. 5B. Specifically, valves 510-1 through 510-4 are closed and valves 510-5 through 510-8 are opened.

At operation 210, generator system 406 generates electrical energy and provides it to power management system 404. Generator system 406 generates electrical energy by enabling pump 512 to pump working fluid 506 to heat exchanger 408, where the heat of the water flowing through conduit 522 vaporizes working fluid 506. The expanding vapor turns turbogenerator 502. In response, turbogenerator 502 generates electrical energy and provides it to power management system 404 on cable 416.

After passing through turbogenerator 502, the vapor is conveyed to heat exchanger 412. At heat exchanger 412, closed-loop conduit 504 and thermal mass 414 are thermally coupled, which enables thermal mass 414 to act as a heat sink for the vaporized working fluid 506. As a result, the vaporized working fluid is condensed at heat exchanger 412.

Once it is condensed, pump 512 recycles working fluid 506 back into heat exchanger 408 where it is vaporized again to continue the cycle that powers turbogenerator 502.

At optional operation 211, vehicle 100 is moved to Region1 and method 200 continues with operation 202.

It should be noted that, although method 200 is depicted as returning to operation 202 from operation 211, one skilled in the art will recognize that thermal mass 414 can alternatively be thermally coupled with water from Region3 after operation 211. Once thermal mass 414 has attained a suitable temperature based on the temperature of the water in Region3, vehicle 100 can be moved to either Region1 or Region2 to continue method 200 from an appropriate operation.

By virtue of its ability to harvest thermal energy from its surrounding environment, the present invention enables a vehicle to remain on station for long periods of time (neglecting mechanical or electrical failures). In some regions of the world, such as tropical areas, a vehicle in accordance with the present invention can remain on station substantially indefinitely.

Figure 6:
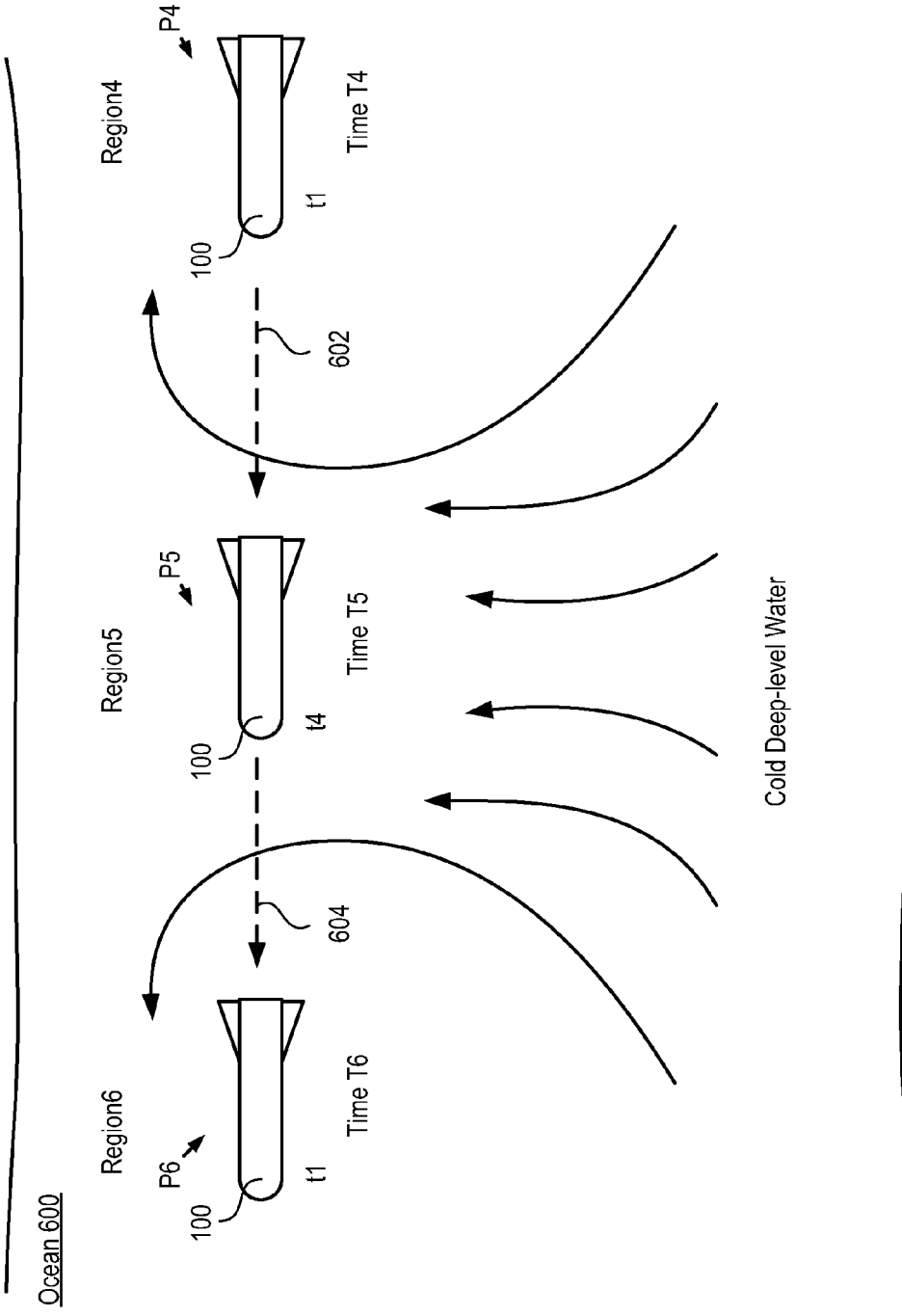
FIG. 6 depicts a plot of exemplary motion of vehicle 100 in an oceanic region comprising an upwelling current.

FIG. 6 depicts a plot of exemplary motion of vehicle 100 in an oceanic region comprising an upwelling current. Successive positions for vehicle 100 are depicted as P4 in Region4 at time T4, P5 in Region5 at time T5, and P6 in Region6 at time T6.

Region4 is a surface region of ocean 600. The temperature, t1, of the water in Region4 is warm, relative to the water in deep-level regions of ocean 600.

Region5 is also a surface region of ocean 600; however, Region5 is an area characterized by an upwelling current. As a result, the temperature, t4, of the water in Region5 is cold, relative to t1—even though Region4 and Region5 are at substantially the same depth of ocean 600.

Region6 is also a surface region of ocean 600 at substantially the same depth as Region4. The temperature of the water in Region6 is the same as the temperature of the water in Region4 (i.e., t1).

In an oceanic region that comprises an upwelling current, vehicle 100 is capable of substantially indefinite operation without having to change depths within the body of water. By virtue of the upwelling current, a large thermal gradient can occur within a narrow vertical cross-section of the body of water. As a result, vehicle 100 can exploit these thermal gradients in the same manner as in method 200.

An exemplary method for moving vehicle through ocean 600 begins with vehicle 100 residing in Region4 for a time suitable to enable the temperature of thermal mass 414 to reach temperature t1. Once thermal mass 414 attains this temperature, vehicle 100 moves into Region5 along path 602. Upon entering Region5, valve system 508 is reconfigured as depicted above in FIG. 5A. This reconfiguration enables turbogenerator 502 to generate electrical energy due to the difference in the temperatures of the waters in Region4 and Region5. The generated electrical energy can be used to power propulsion system 312, power on-board electronics, and/or be stored in battery 422.

As vehicle 100 dwells in Region5, the temperature of thermal mass 414 cools to a temperature based on t2. The cooling of thermal mass 414 can occur reactively (i.e., due to heat lost to working fluid 506), proactively (i.e., by actively cooling thermal mass 414 via heat exchanger 416, or by a combination of reactive and proactive cooling. Once thermal mass 414 reaches its desired temperature, vehicle 100 moves into Region6.

In Region6, valve system 508 is reconfigured as depicted in FIG. 5B. This enables turbogenerator 502 to generate electrical energy due to the difference in the temperatures of the waters in Region5 and Region6.

Prolonged operation of vehicle 100 within ocean 600, therefore, can be achieved simply by moving vehicle 100 back and forth across the boundaries that separate Region5 from Region4 and Region6 and reconfiguring valve system 508 appropriately.

Figure 7:
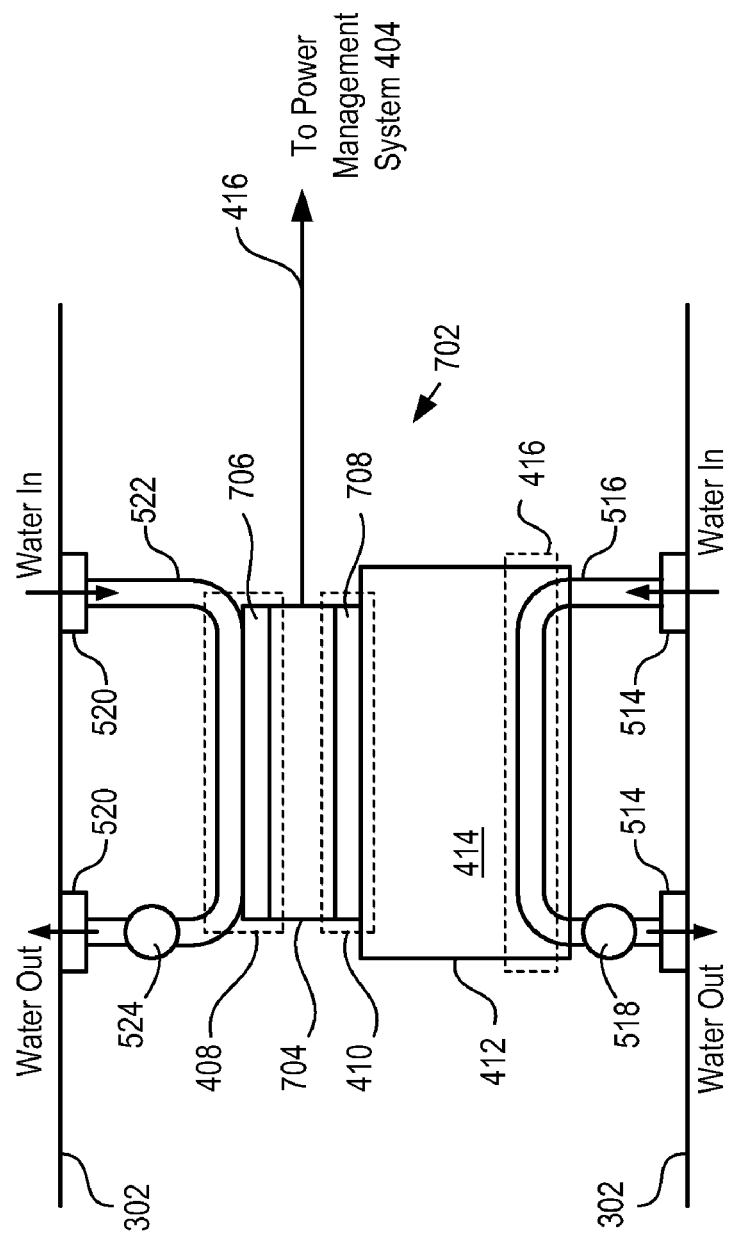
FIG. 7 depicts a schematic diagram of an electrical generation system in accordance with an alternative embodiment of the present invention.

FIG. 7 depicts a schematic diagram of an electrical generation system in accordance with an alternative embodiment of the present invention. Electrical generation system 700 comprises generator system 702, heat exchangers 408, 410, and 416, and chamber 412.

Generator system 702 is a system for generating electrical energy based on a temperature differential across a solid-state thermoelectric element. Generator system 702 comprises solid-state thermoelectric element 704 and thermal plates 706 and 708.

Thermoelectric element 704 is a solid-state thermoelectric device that comprises a bismuth-telluride alloy. Thermoelectric element 704 generates an open-circuit voltage in response to a thermal gradient placed across it. Commercial examples of thermoelectric element 704 include HZ modules available from Hi-Z Technology, Inc. In some embodiments, thermoelectric element 704 comprises a thermoelectric material other than bismuth-telluride. Thermoelectric materials suitable for use in thermoelectric element 704 include, without limitation, traditional thermocouple materials, quantum well materials (e.g silicon-silicon germanium and semi-conducting silicon carbide) In some embodiments, thermoelectric element 704 is a solid-state element that generates electrical energy by means of the Peltier effect.

Conduit 522 and plate 706 collectively define heat exchanger 710. At heat exchanger 710, plate 706 is brought to a temperature based on the temperature of the water flowing through water conduit 522.

Plate 708 is thermally coupled with wall 712 of chamber 412 such that plate 708 is thermally coupled with thermal mass 414. Plate 708 and wall 712 collectively define heat exchanger 714. By virtue of heat exchanger 714, plate 708 is brought to a temperature based on the temperature of thermal mass 414.

By virtue of a temperature differential between thermal mass 414 and water flowing through conduit 522, thermoelectric element 704 generates electrical energy and provides it to power management system 404 on cable 416. In embodiments wherein vehicle 100 comprises a solid state thermoelectric element, power management system 404 comprises circuitry for managing the polarity of generated electrical energy in any region of a body of water.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A vehicle comprising:
    a hull;
    a thermal mass, wherein the thermal mass is contained within the hull, and wherein the temperature of the thermal mass is based on the temperature of water in a first region of a body of water;
    a first heat exchanger, wherein the temperature of the first heat exchanger is based on the temperature of the thermal mass;
    a second heat exchanger, wherein the temperature of the second heat exchanger is based on the temperature of water in a second region of the body of water;
    a thermoelectric generator, wherein the thermoelectric generator generates electrical energy based on a temperature difference between the first heat exchanger and the second heat exchanger; and
    a propulsion system, wherein the propulsion system receives electrical energy generated by the thermoelectric generator and propels the hull through the body of water in response to the received electrical energy.

2. The vehicle of claim 1 wherein the thermal mass comprises a phase-change material.

3. The vehicle of claim 2 wherein the phase-change material comprises a clathrate compound.

4. The vehicle of claim 1 wherein the thermal mass comprises water from the first region.

5. The vehicle of claim 1 wherein the thermoelectric generator comprises a Rankine-cycle engine.

6. The vehicle of claim 1 wherein the thermoelectric generator comprises a solid-state thermoelectric element.

7. The vehicle of claim 1 further comprising a valve system, wherein the valve system enables the thermoelectric generator to generate electrical energy when the temperature difference is positive, and wherein the valve system enables the thermoelectric generator to generate electrical energy when the temperature difference is negative.

8. The vehicle of claim 1 further comprising a battery, wherein the battery stores electrical energy generated by the thermoelectric generator, and wherein the battery provides electrical energy to the propulsion system.

9. A self-propulsive vehicle comprising:
a first heat exchanger whose temperature is based on water in a first region of a body of water, wherein the first region is proximate to the vehicle;
a chamber, wherein the chamber comprises a first physical adaptation for containing a thermal mass, wherein the temperature of the thermal mass is based on the temperature of water in a second region of the body of water;
a thermoelectric generator that generates electrical energy based on a temperature difference between the temperature of first heat exchanger and the temperature of the thermal mass; and
a propulsion system, wherein the propulsion system comprises a second physical adaptation that enables the propulsion system to propel the vehicle through the body of water in response to the receipt of electrical energy generated by the thermoelectric generator.

10. The vehicle of claim 9 further comprising the thermal mass.

11. The vehicle of claim 10 wherein the thermal mass comprises a phase-change material.

12. The vehicle of claim 11 wherein the phase-change material comprises a clathrate compound.

13. The vehicle of claim 10 wherein the thermal mass comprises water from the second region.

14. The vehicle of claim 9 wherein the thermoelectric generator comprises a Rankine-cycle engine.

15. The vehicle of claim 9 wherein the thermoelectric generator comprises a solid-state thermoelectric element.

16. The vehicle of claim 9 further comprising a valve system, wherein the valve system enables the thermoelectric generator to generate electrical energy when the temperature difference is positive, and wherein the valve system enables the thermoelectric generator to generate electrical energy when the temperature difference is negative.

17. A method comprising:
positioning a vehicle in a first region of a body of water, wherein the vehicle comprises a thermal mass, a thermoelectric generator that generates electrical energy based on a temperature difference between the thermal mass and a first heat exchanger, and a propulsion system;
establishing a first temperature for the thermal mass, wherein the first temperature is based on the temperature of water in the first region;
moving the vehicle to a second region of the body of water, wherein the temperature of the water in the second region is at a second temperature;
generating electrical energy based on a difference between the first temperature and the second temperature; and
powering the propulsion system with the generated electrical energy.

18. The method of claim 17 further comprising:
thermally coupling the first heat exchanger and water from the second region;
thermally coupling the thermoelectric generator and the thermal mass;
thermally coupling the thermoelectric generator and the first heat exchanger.

19. The method of claim 17 further comprising:
establishing a third temperature for the thermal mass, wherein the third temperature is based on the temperature of water in the second region;
moving the vehicle to a third region of the body of water, wherein the temperature of the water in the third region is at a fourth temperature;
generating electrical energy based on a difference between the third temperature and the fourth temperature.

20. The method of claim 17 further comprising providing the thermal mass, wherein the thermal mass comprises a phase-change material.

21. The method of claim 17 wherein the first temperature is established by thermally coupling the thermal mass and water from the first region.

22. The method of claim 17 wherein the first temperature is established by providing the thermal mass as water from the first region.

* * * * *